United States Patent
Chien et al.

(10) Patent No.: US 6,871,305 B2
(45) Date of Patent: Mar. 22, 2005

(54) DEVICE FOR PROLONGING LIFETIME OF NONVOLATILE MEMORY

(75) Inventors: Cheng-Chih Chien, Tai-Chung (TW); Bing-Fei Wu, Hsinchu (TW); Jou-Wei Fu, Hsinchu (TW); Wen-Chung Chang, Hsinchu (TW)

(73) Assignee: Silicon Motion, Inc., Hsinchu (TW)

( * ) Notice: Subject to any disclaimer, the term of this patent is extended or adjusted under 35 U.S.C. 154(b) by 610 days.

(21) Appl. No.: 09/879,979

(22) Filed: Jun. 14, 2001

(65) Prior Publication Data

US 2002/0194556 A1 Dec. 19, 2002

(51) Int. Cl.$^7$ .......................... G11C 29/00; G11C 16/06
(52) U.S. Cl. .................................. 714/718; 365/185.09
(58) Field of Search ..................... 714/718; 365/185.09, 365/201, 185

(56) References Cited

U.S. PATENT DOCUMENTS 5,561,632 A * 10/1996 Arase et al. ........... 365/185.33
5,930,169 A * 7/1999 Iwata et al. ............ 365/185.09
6,160,739 A * 12/2000 Wong ..................... 365/185.29

* cited by examiner

Primary Examiner—Guy J. Lamarre
Assistant Examiner—Cynthia Britt
(74) Attorney, Agent, or Firm—Bacon & Thomas, PLLC

(57) ABSTRACT

A device for prolonging the lifetime of a nonvolatile memory is applied to the connection between a host electronic machine and a nonvolatile memory device. The device includes a RAM (Random Access Memory) buffer zone, a counter, and two sets of inverters, wherein the RAM buffer zone is employed to store a unit data train temporarily; the counter is used to count the total bits of logic "0"; the inverters are used to lessen the times for readying/writing a nonvolatile memory device by inverting the unit data train based on the count (for example, when the number of logic "1"s exceeds the number of logic "0"s, and the state flag keeps track of whether an inversion has occurred or is needed.

3 Claims, 2 Drawing Sheets

DEVICE FOR PROLONGING LIFETIME OF NONVOLATILE MEMORY

FIELD OF THE INVENTION

This invention relates generally to nonvolatile memories, and more particularly, to a device for prolonging the lifetime of a nonvolatile memory that can lessen impairment of the memory due to repeated read/write operations.

BACKGROUND OF THE INVENTION

A memory unit is defined as "nonvolatile" if no inside data is lost after disconnection of the power supply. Therefore, the nonvolatile memory plays a very important role in both the computer and the telecommunication industries. This is especially true of the flash memory, which is one of the hot products in today's nonvolatile memory market.

However, the nonvolatile flash memory is intrinsically limited with respect to operation times because the inside memory cells must be refreshed based on the principle of hot-carriers field effect, as a result of which inside data thereof must be erased and rewritten with 1s instead of previously existed 0s and is before writing new data. During writing, because the required operational voltage is 7V or higher the oxidation layer in the flash memory may be impaired to some extent by repeatedly writing and erasing operations that would undoubtedly shorten its lifetime, For improving the above said defect, only a few protective measures are available so far, such as employing arithmetic to uniformly use every block in the flash memory and thereby potentially prolong the lifetime of the memory by as long as one million times. This known effect may be enhanced when associated with the present invention.

SUMMARY OF THE INVENTION

The primary object of this invention is to provide a device for prolonging lifetime of a nonvolatile memory such that the ion of the nonvolatile memory can be lessoned during repeatedly reading/writing operations.

In order to realize the above said object, a device for prolonging the lifetime of the nonvolatile memory is applied, according to the principles of the invention, to connect a host electronic machine with a nonvolatile memory unit, and comprises a RAM (Random Access Memory) buffer zone, a counter, and two sets of inverters.

The RAM buffer zone connected to the counter and the inverters is employed for temporary storage of a unit data train and a corresponding state flag during access when a host electronic machine is to read/write from or to the nonvolatile memory, such that the state flag will indicate the operation state when the unit data train passes through the inverters.

The counter connected with the host electronic machine and the RAM buffer zone is in charge of counting the total bits of logic "0" is the unit data train and judging if the counted result outnumbers a default proportion. If positive, the state flag corresponding to the unit data train is turned into "0", otherwise, into "1".

The interpolated inverters are arranged to lessen the times of reading/writing the nonvolatile memory by checking a corresponding state flag of the unit data train to decide whether a logic inversion of the unit data train is needed or not. By doing so, the device of this invention will write relatively fewer bits of toxic "0" for prolonging the lifetime of the nonvolatile memory.

For more detailed information regarding advantages or features of this invention, at least an example of preferred embodiment will be elucidated below with reference to the annexed drawings.

BRIEF DESCRIPTION OF THE DRAWINGS

The related drawings in connection with the detailed description of this invention, which is to be made later, are described briefly as follows, in which.

DETAILED DESCRIPTION OF INVENTION

Figure 1:
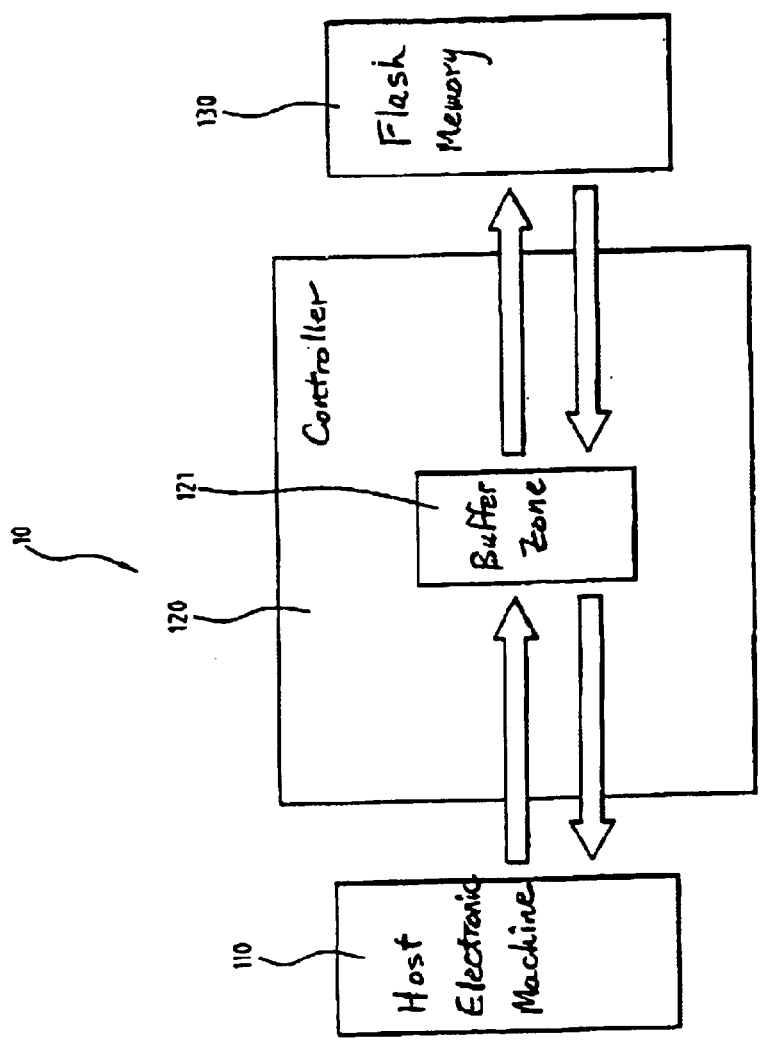
FIG. 1 shows a hardware framework of a conventional nonvolatile memory device.

In a hardware framework of a conventional nonvolatile memory device shown is FIG. 1, when as electronic machine 10 is to write a unit data train to a flash memory 130, the unit data train is transmitted from a host electronic machine 110 to the flash memory 130 via a buffer zone 121 of a Random Access Memory (RAM) in a controller 120. On the other hand, when the electronic machine 10 is to read a unit data train stored in the flash memory 130, the operation is reversed. The afore-mentioned unit data train is substantially a page of data is an average flash memory.

Figure 2:
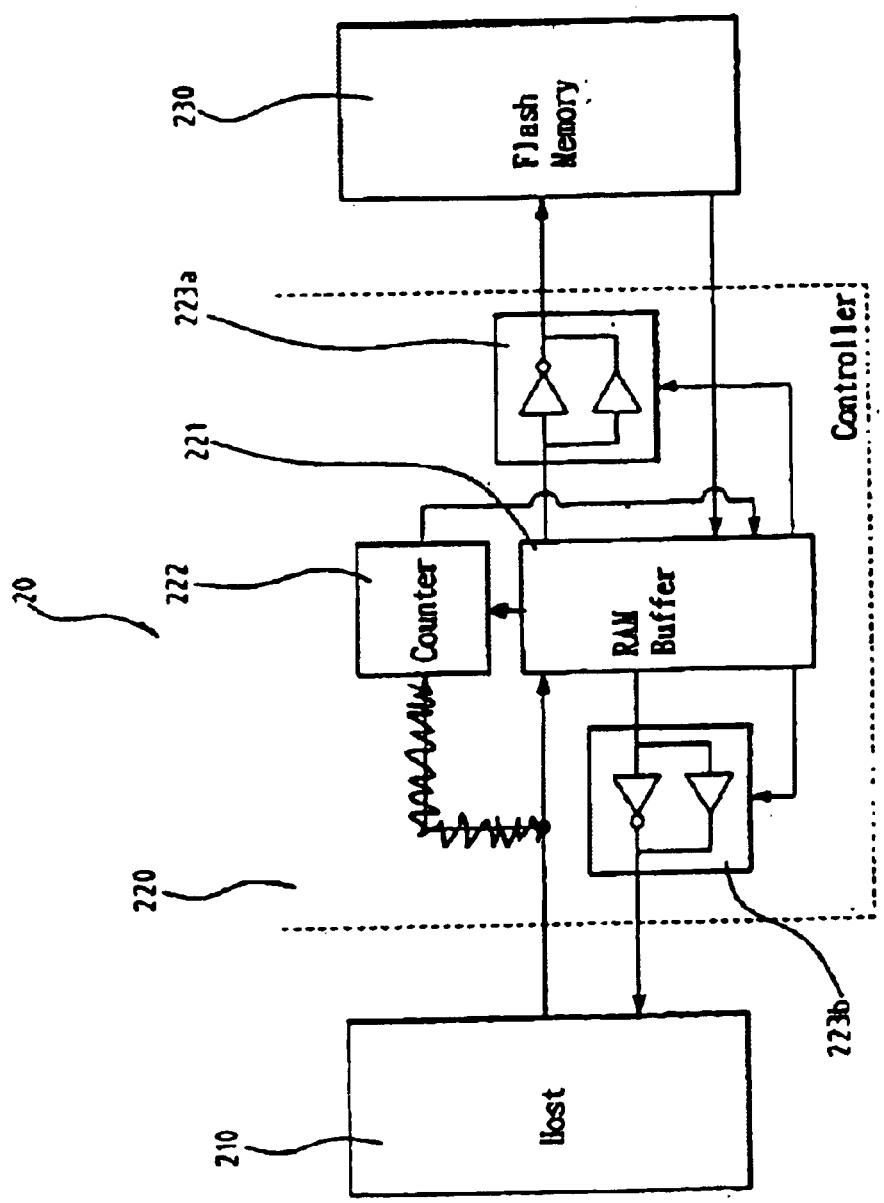
FIG. 2 shows a hardware framework of a nonvolatile memory device of this invention.

FIG. 2 shows a hardware framework of a nonvolatile memory device according to a preferred embodiment of the present invention, in which the controller 174 in FIG. 1 is replaced with a RAM buffer zone 221; a counter 222; and two sets of inverters 223a, 223b.

The RAM buffer zone 221 is connected to the counter 222 and the inverters 223a, 223b, and is employed for temporary storage of a unit data train and a corresponding state flag during access when a host electronic machine 210 is to read/write from or to a flash memory unit 230, a which time the state flag will indicate the operation state when the unit data train passes through the inverters 223a, 223b. In the illustrated example, the unit data train comprises 528 bytes including 512 bytes for a data district and 16 bytes for recording the state flag corresponding to the unit data train.

The counter 222 which is connected with the RAM buffer zone 221 is in charge of counting the total bits of logic "0" in the unit data train temporarily stored in the RAM buffer zone 221 and judging if the counted result outnumbers a default proportion, 50% for example. If positive, the state flag corresponding to the unit data train is turned into "0", otherwise, into "1".

The inverter 223a is arranged to invert the logic phase of the unit data train before the host electronic machine 210 writes the unit data train to this flash memory 230 when the state flag is found to be "0". On the other hand, no logic phase invasion is made in the case the state flag is found to be "1".

When the host electronic machine 210 is to read a unit data train from the flash memory unit 230 and finds that the state flag is "0", it means that the unit data train to be read has been inverted before. At this time, the data train must be inverted by the inverter 223b once more for restoration before being read. Contrarily, if the state flag reads "1", the unit data train is ready for the original data to be read without needing any logic inversion. The elaboration of the interpolated inverters 223a, 223b is in short intended to write fewer bits of logic "0" and thereby prolong the lifetime of the nonvolatile memory.

In the above described, at least one preferred embodiment has been described is detail with reference to the drawings annexed, and it is apparent that numerous variations of modifications may be made without departing from the true spirit and scope thereof, as set forth is the claims below.

What is claimed is:

1. A device for prolonging lifetime of nonvolatile memory, the device being connected with a host electronic machine and a nonvolatile memory unit, comprising a RAM (Random Access Memory) buffer zone, a counter, and two sets of inverters, wherein:

the RAM buffer zone is connected with the counter and the inverters and employed for temporary storage of a unit data train and a corresponding state flag during when a host electronic machine is to read/write from or to the nonvolatile memory unit, wherein the state flag determines whether the unit data train is to be inverted by the inverters;

the counter connected with the host electronic machine and the RAM buffer zone is in charge of counting the total bits of logic "0" in the unit data train and judging whether the counted result outnumbers a default proportion or not, wherein if a counted result outnumbers a default proportion, the state flag corresponding to the unit data train is turned into "0", otherwise, the state flag corresponding to the unit data train is turned into "1"; and the inverters are arranged to check the corresponding state flag of the unit and invert the unit data train if the state flag has been turned into "0";

whereby the electronic machine will write fewer bits of logic "0" to prolong the lifetime of the nonvolatile memory unit.

2. The device according to claim 1, wherein said default proportion is 50%, whereby whenever a number of "0"s in said data train exceeds a number of "1"s, an inverse operation is carried out on said unit data train.

3. The device according to claim 1, wherein upon reading a unit data train, said inverters are arranged to again invert said unit data train, if the unit data train was previously inverted during writing as indicated by said state flag.

* * * * *